United States Patent
Döbler et al.

(10) Patent No.: US 12,244,132 B2
(45) Date of Patent: Mar. 4, 2025

(54) CIRCUIT BREAKER DEVICE AND METHOD

(71) Applicant: Siemens Aktiengesellschaft, Munich (DE)

(72) Inventors: Fabian Döbler, Theilenhofen (DE); Christopher Fromme, Fürth (DE); Dominic Malane, Eichstätt (DE); Marvin Tannhäuser, Hausen (DE)

(73) Assignee: Siemens Aktiengesellschaft, Munich (DE)

( * ) Notice: Subject to any disclaimer, the term of this patent is extended or adjusted under 35 U.S.C. 154(b) by 71 days.

(21) Appl. No.: 18/258,597

(22) PCT Filed: Dec. 16, 2021

(86) PCT No.: PCT/EP2021/086123
§ 371 (c)(1),
(2) Date: Jun. 21, 2023

(87) PCT Pub. No.: WO2022/136091
PCT Pub. Date: Jun. 30, 2022

(65) Prior Publication Data
US 2024/0047957 A1    Feb. 8, 2024

(30) Foreign Application Priority Data

Dec. 21, 2020   (DE) .................... 10 2020 216 396.0

(51) Int. Cl.
*H02M 3/00* (2006.01)
*H02H 3/05* (2006.01)
*H02H 3/38* (2006.01)

(52) U.S. Cl.
CPC ................ *H02H 3/05* (2013.01); *H02H 3/38* (2013.01)

(58) Field of Classification Search
CPC . H02H 3/05; H02H 3/38; H02H 3/044; G01R 19/16547
See application file for complete search history.

(56) References Cited

U.S. PATENT DOCUMENTS 3,662,182 A    5/1972   Ullmann et al.
6,140,806 A *  10/2000  Gohara .................. H03K 17/18
                                            323/283
(Continued)

FOREIGN PATENT DOCUMENTS

CH        497805 A    10/1970
DE      10005864 A1   1/2001
(Continued)

OTHER PUBLICATIONS

OEZ Modeion: "Moulded case circuit breakers," Catalog 2013, retrieved http://oezco.ir/wp-content/ploads/2016/11 /3%20pdf.pdf.
(Continued)

*Primary Examiner* — Adolf D Berhane
*Assistant Examiner* — Afework S Demisse
(74) *Attorney, Agent, or Firm* — Laurence A. Greenberg; Werner H. Stemer; Ralph E. Locher

(57) ABSTRACT

A circuit breaker device protects an electric low-voltage current circuit. A level of a voltage of a low-voltage current circuit is ascertained such that ascertained voltage values are provided. A differential voltage is ascertained from the ascertained voltage values and an expected value of the voltage such that differential voltage values are provided incrementally. Each differential voltage value is compared with a first threshold, and if at least two successive differential voltage values exceed the threshold, an interruption of the low-voltage current circuit is initiated by semiconductor- (Continued)

based switching elements, which are set to a high-ohmic state, in order to protect the low-voltage current circuit from a short-circuit.

20 Claims, 3 Drawing Sheets

(56) References Cited

U.S. PATENT DOCUMENTS

| | | | |
|---|---|---|---|
| 6,335,577 | B1 | 1/2002 | Baba |
| 10,541,530 | B2 | 1/2020 | Kennedy et al. |
| 11,552,468 | B2 | 1/2023 | Luebke et al. |
| 2001/0010458 | A1* | 8/2001 | Ohshima ............ H03K 17/0822 323/282 |
| 2006/0227469 | A1 | 10/2006 | Parker et al. |
| 2009/0179631 | A1 | 7/2009 | Hu et al. |
| 2017/0256934 | A1 | 9/2017 | Kennedy et al. |
| 2019/0229529 | A1 | 7/2019 | Askan et al. |
| 2019/0371557 | A1 | 12/2019 | Haslinger |
| 2020/0321767 | A1 | 10/2020 | Meyer et al. |
| 2020/0321768 | A1 | 10/2020 | Schegner et al. |

FOREIGN PATENT DOCUMENTS

| | | |
|---|---|---|
| DE | 102008052949 A1 | 4/2010 |
| DE | 102015016022 A1 | 6/2016 |
| DE | 102016123955 A1 | 6/2018 |
| DE | 102018101312 A1 | 7/2019 |
| EP | 0509652 A2 | 10/1992 |
| EP | 0802602 A2 | 10/1997 |
| EP | 1840584 A2 | 10/2007 |
| EP | 2426802 A2 | 3/2012 |
| EP | 3700038 B1 | 9/2022 |
| GB | 2531787 A | 5/2016 |
| WO | 2017207030 A1 | 12/2017 |
| WO | 2017207031 A1 | 12/2017 |
| WO | 2017207031 A9 | 1/2019 |
| WO | 2020169753 A1 | 8/2020 |

OTHER PUBLICATIONS

Video "Motus<IDC14 Launch Event", live online since Nov. 24, 2020, https://www.motus-c14.de/de/event.
Mützel, T .: Dissertation "Verfahren zur Kurzschlussfrüherkennung zur Verbesserung der strombegrenzenden Wirkung mechanischer Leistungsschalter im Kurzschlussfall" [Procedure for early short-circuit detection to improve the current-limiting effect of mechanical circuit breakers in the event of a short-circuit], 2008, Technische Universität Ilmenau—English abstract.
Presentation "Motus<IDC14", (Sep. 8, 2020), shown at a customer presentation appointment with the patent owner on Oct. 29, 2020.
Lindmayer, M. et al:. "Digitale Algorithmen zur frühzeitigen Kurzschlußerkennung", [Digital algorithms for early short-circuit detection], Elektrotechnische Zeitschrift ETZ, Issue: 112/13-14, 1991, pp. 718-722—English abstract.
Wöhner: Collection of delivery notes for Motus<IDC14 products, all dated to the period between Feb. 12, 2020 and Dec. 16, 2020.

* cited by examiner

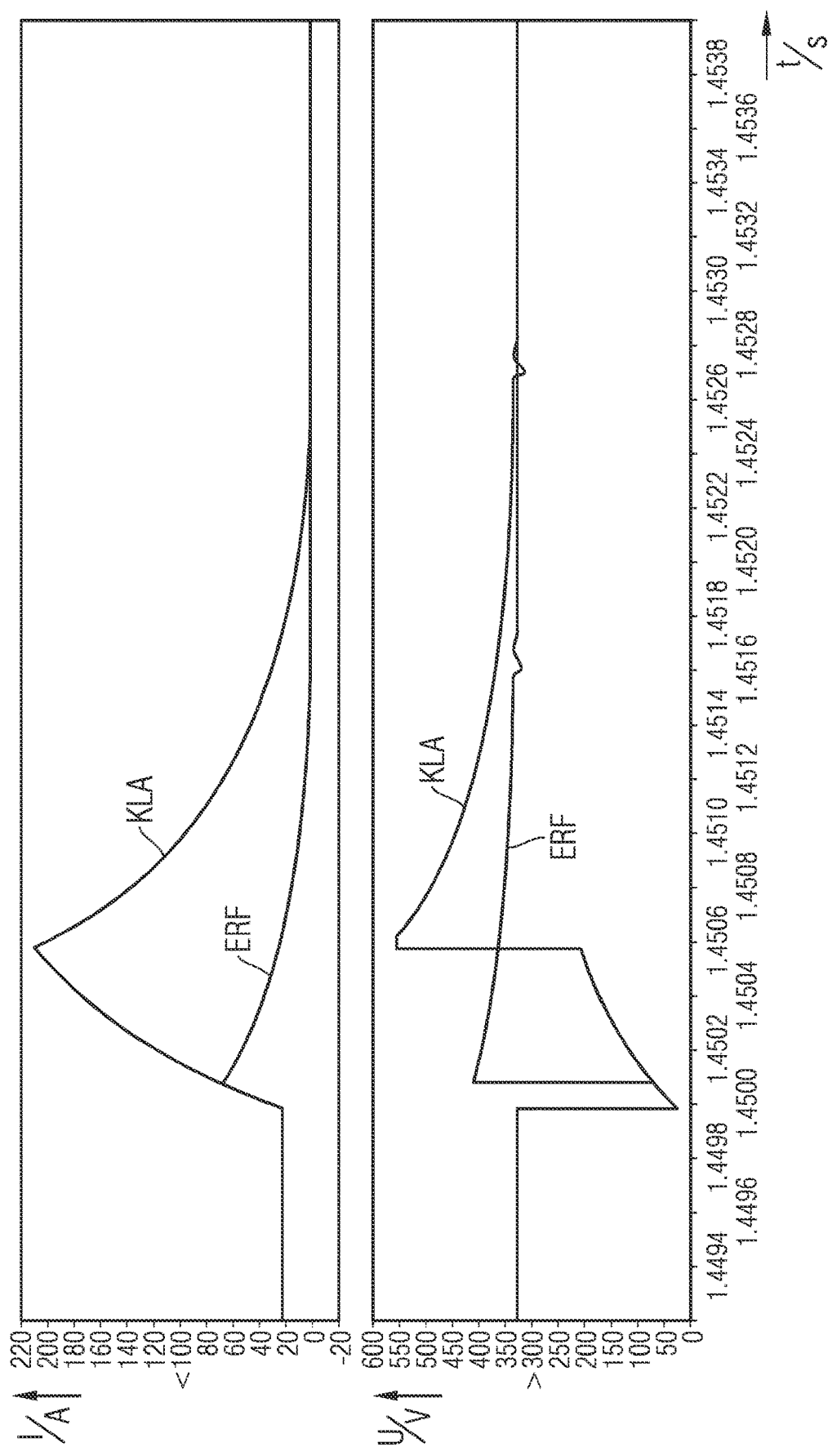

CIRCUIT BREAKER DEVICE AND METHOD

FIELD AND BACKGROUND OF THE INVENTION

The invention relates to the technical field of a circuit breaker device for a low-voltage circuit, in particular having an electronic interruption unit, according to the preamble of the independent circuit breaker device patent claim and to a method for a circuit breaker device for a low-voltage circuit according to the preamble of the independent method patent claim.

Low voltage means voltages of up to 1000 volts AC or up to 1500 volts DC. Low voltage means in particular voltages that are greater than extra-low voltage, with values of 50 volts AC or 120 volts DC.

Low-voltage circuit or system or installation means circuits having nominal currents or rated currents of up to 125 amps, more specifically up to 63 amps. Low-voltage circuit means in particular circuits having nominal currents or rated currents of up to 40 amps, 32 amps, 25 amps, 16 amps or 10 amps. The stated current values mean in particular nominal, rated or/and interrupting currents, i.e. the maximum current normally carried via the circuit or usually resulting in the electrical circuit being interrupted, for example by a protective device, such as a circuit breaker device, miniature circuit breaker or power breaker.

Miniature circuit breakers are overcurrent protective devices that have been known for a long time and are employed in low-voltage circuits in electrical installation engineering. They protect lines from damage as a result of heating due to excessively high current and/or short circuit. A miniature circuit breaker can automatically break the circuit in the event of overload and/or short circuit. A miniature circuit breaker is a fusing element that does not automatically reset.

Power breakers, in contrast to miniature circuit breakers, are provided for currents greater than 125 A, in some cases even from as little as 63 amps. Miniature circuit breakers are therefore of simpler and more delicate design. Miniature circuit breakers normally have a mounting option for mounting on what is known as a top-hat rail (mounting rail, DIN rail, TH35).

Miniature circuit breakers are of electromechanical design. They have a mechanical switching contact or open-circuit shunt release in a housing in order to interrupt (trip) the electrical current. A bimetallic protective element or bimetallic element is normally used for tripping (interruption) in the event of longer-lasting overcurrent (overcurrent protection) or in the event of thermal overload (overload protection). An electromagnetic trip with a coil is employed for brief tripping when an overcurrent limit value is exceeded or in the event of a short circuit (short circuit protection). One or more arc extinguishing chamber(s) or devices for arc extinction are provided. In addition, connecting elements for conductors of the electrical circuit that is to be protected.

Circuit breaker devices having an electronic interruption unit are relatively novel developments. They have a semiconductor-based electronic interruption unit. That is to say that the flow of electric current in the low-voltage circuit is carried via semiconductor components or semiconductor switches that are able to interrupt the flow of electric current or to be switched on. Circuit breaker devices having an electronic interruption unit frequently furthermore have a mechanical isolating contact system, in particular having isolator properties according to relevant standards for low-voltage circuits, the contacts of the mechanical isolating contact system being connected in series with the electronic interruption unit, i.e. the current in the low-voltage circuit to be protected is carried via both the mechanical isolating contact system and the electronic interruption unit.

In the case of semiconductor-based circuit breaker devices or protection equipment, solid-state circuit breakers, SSCB for short, the switching energy does not need to be converted into an arc as in the case of a mechanical switching device, but rather needs to be converted into heat by means of an additional circuit, the energy absorber. The breaking energy comprises the energy stored in the circuit, i.e. in the system, line or load impedances. In order to relieve the load on the energy absorber, the current flowing at the time of breaking needs to be as small as possible. This also applies in the case of a short circuit. Here, the current rises very quickly. Rapid short-circuit detection allows a short circuit to be detected early and an excessively high short-circuit current to be avoided. The semiconductor-based circuit breaker device interrupts the circuit, within the context of a break operation, almost without delay, within µs. No high currents arise and the load on the energy absorber of a semiconductor-based circuit breaker device is reduced. Known short-circuit detection systems or break criteria are normally based on the ascertainment and evaluation of the actual value of the current.

SUMMARY OF THE INVENTION

The object of the present invention is to improve a circuit breaker device of the type mentioned at the outset, in particular to demonstrate a fast and alternative option for short-circuit detection and to ensure reliable interruption.

This object is achieved by a circuit breaker device having the features of the independent circuit breaker device patent claim and by a method according to the independent method patent claim.

According to the invention, there is provision for a circuit breaker device for protecting an electrical low-voltage circuit, in particular low-voltage AC circuit, comprising:
- a housing having connections for conductors of the low-voltage circuit,
- an electronic interruption unit that, as a result of semiconductor-based switching elements, has a high-impedance state for the switching elements for the purpose of interruption and a low-impedance state for the switching elements for the purpose of current flow in the low-voltage circuit,
- a control unit connected to the interruption unit.

According to the invention, there is provision for a voltage ascertainment device connected to the control unit, for the purpose of ascertaining voltage values. The circuit breaker device is configured such that the ascertained voltage values and an expected value for the voltage are used to ascertain a difference voltage, with the result that difference voltage values are available cyclically. Each difference voltage value is compared with a first threshold value, in particular in terms of absolute value. If at least two, in particular precisely three or at least three, successive difference voltage values have exceeded, the electronic interruption unit initiates interruption of the low-voltage circuit in order to protect the low-voltage circuit from short circuits.

According to the invention, there is advantageously no provision for a current ascertainment device or a current sensor, rather only a voltage ascertainment device or a voltage sensor. Short circuits are ascertained solely on the basis of a voltage measurement between the (two) conductors of the low-voltage circuit. Short circuit monitoring can thus advantageously be integrated, for example subsequently, without interrupting conductors of the low-voltage circuit.

Advantageous configurations of the invention are specified in the subclaims.

In one advantageous configuration of the invention, there is provision for a current ascertainment device, such as a current sensor, connected to the control unit such that the change in current over time in the low-voltage circuit is ascertained periodically, with the result that current change values are available cyclically. Each current change value is compared with a second threshold value. Interruption of the low-voltage circuit is initiated if at least two, in particular two or at least three, successive current change values have exceeded.

This has the particular advantage that, irrespective of whether a voltage change value has exceeded, interruption is initiated if at least two (precisely two, at least three) (successive) current change values have exceeded. There is thus a second criterion that increases tripping reliability, since an overcurrent or short circuit is linked to a change in the current. Tripping reliability can thus be ensured or increased even in the event of failure of the voltage ascertainment device, of the voltage sensor, or in the event of an error in the processing of the voltage values.

In one advantageous configuration of the invention, each voltage change value is compared with the first threshold value, each current change value is compared with the second threshold value, interruption of the low-voltage circuit being initiated if the first and second threshold values are exceeded within a first time window.

Exceeded within a first time window means in particular that the voltage change value and the current change value for the same clock cycle or for preceding or subsequent or adjacent clock cycles have exceeded. This has the particular advantage that very rapid and reliable detection of an overcurrent or short circuit is facilitated, since a current change value and a voltage change value that occur close together in time, i.e. within the first time window, already result in interruption of the electrical low-voltage circuit.

In one advantageous configuration of the invention, the difference voltage values or/and current change values, in particular also the current values or/and voltage values, are ascertained periodically at a clock frequency that is greater than/equal to 10 kHz and less than/equal to 10 MHz, more specifically greater than/equal to 10 kHz and less than/equal to 1 MHz, in particular around or precisely 50 kHz or around or precisely 100 kHz.

This has the particular advantage that difference voltage values or/and current change values are available cyclically at intervals of time of between 100 µs and 0.1 µs, more specifically between 100 µs and 1 µs. That is to say that very rapid short-circuit detection in the µs range can take place.

In one advantageous configuration of the invention, the second threshold value is in the range from 1 to 10 A/µs, in particular in the range from 1 to 5 A/µs, more specifically in the range from 1 to 2 A/µs, 2 to 3 A/µs or 4 to 5 A/µs.

This has the particular advantage that rapid and reliable detection of short-circuit events is facilitated.

In one advantageous configuration of the invention, the first threshold value is in the range from 10 to 100 volts, in particular in the range from 10 to 50 volts or in the range from 50 volts to 100 volts.

This has the particular advantage that rapid and reliable detection of short-circuit events is facilitated. In particular, particularly sensitive tripping is facilitated for high reliability in the range from 10 to 50 volts. In particular, a particularly robust solution is facilitated, in particular for industrial applications, in the range from 50 to 100 volts.

In one advantageous configuration of the invention, the difference voltage values are supplied to a first comparator in order to compare each difference voltage value with the first threshold value. The output of the first comparator is connected to a first AND gate:
firstly directly,
secondly via a first buffer store, which buffer-stores precisely one comparator output value,
alternatively thirdly via the first buffer store with a second buffer store, which buffer-stores precisely one comparator output value,
alternatively via further buffer stores,
with the result that interruption of the low-voltage circuit is initiated if at least two, in particular two, three or at least three, successive difference voltage values have exceeded.

This has the particular advantage that there is a simple structure for implementing the voltage monitoring of the invention for the purpose of overcurrent detection.

In one advantageous configuration of the invention, the current change values are supplied to a second comparator in order to compare each current change value with the second threshold value. The outputs of the first and second comparators are combined by way of a second AND gate, with the result that interruption of the low-voltage circuit is initiated if the first and second threshold values are exceeded.

This has the particular advantage that there is a simple structure for implementing the rapid detection of short circuits on the basis of the voltage change value and current change value having exceeded.

In one advantageous configuration of the invention, the output of the second comparator is further connected to a third AND gate firstly directly and secondly via at least one third buffer store, which buffer-stores precisely one comparator output value, with the result that interruption of the low-voltage circuit is initiated if at least two successive current change values have exceeded.

This has the particular advantage that there is a simple structure for implementing the additional current monitoring of the invention for the purpose of detecting short circuits.

In one advantageous configuration of the invention, the outputs of the first, second and third AND gates are combined by way of an OR gate, with the result that interruption of the low-voltage circuit is initiated
if at least two successive difference voltage values have exceeded or
if the first and second threshold values are exceeded within the first time window or
if at least two successive current change values have exceeded.

This has the particular advantage that there is a simple structure for implementing a redundant monitoring circuit of the invention in order to implement a high probability of detecting short circuits and high fail-safety.

Corresponding methods for a circuit breaker device for a low-voltage circuit having electronic (semiconductor-based) switching elements with the same and further advantages are claimed according to the invention.

All configurations, both in dependent form, referring back to the independent patent claims, and referring back only to individual features or combinations of features of patent claims, result in an improvement in a circuit breaker device for rapidly and reliably breaking in the event of overcurrents and short circuits.

The properties, features and advantages of this invention that are described and the way in which they are achieved will become clearer and more distinctly comprehensible in conjunction with the description of the exemplary embodiments that follows, said exemplary embodiments being explained more thoroughly in conjunction with the drawing, in which:

BRIEF DESCRIPTION OF THE FIGURES

FIG. 3 shows a current characteristic and a voltage characteristic as a function of time.

DETAILED DESCRIPTION OF THE INVENTION

Figure 1:
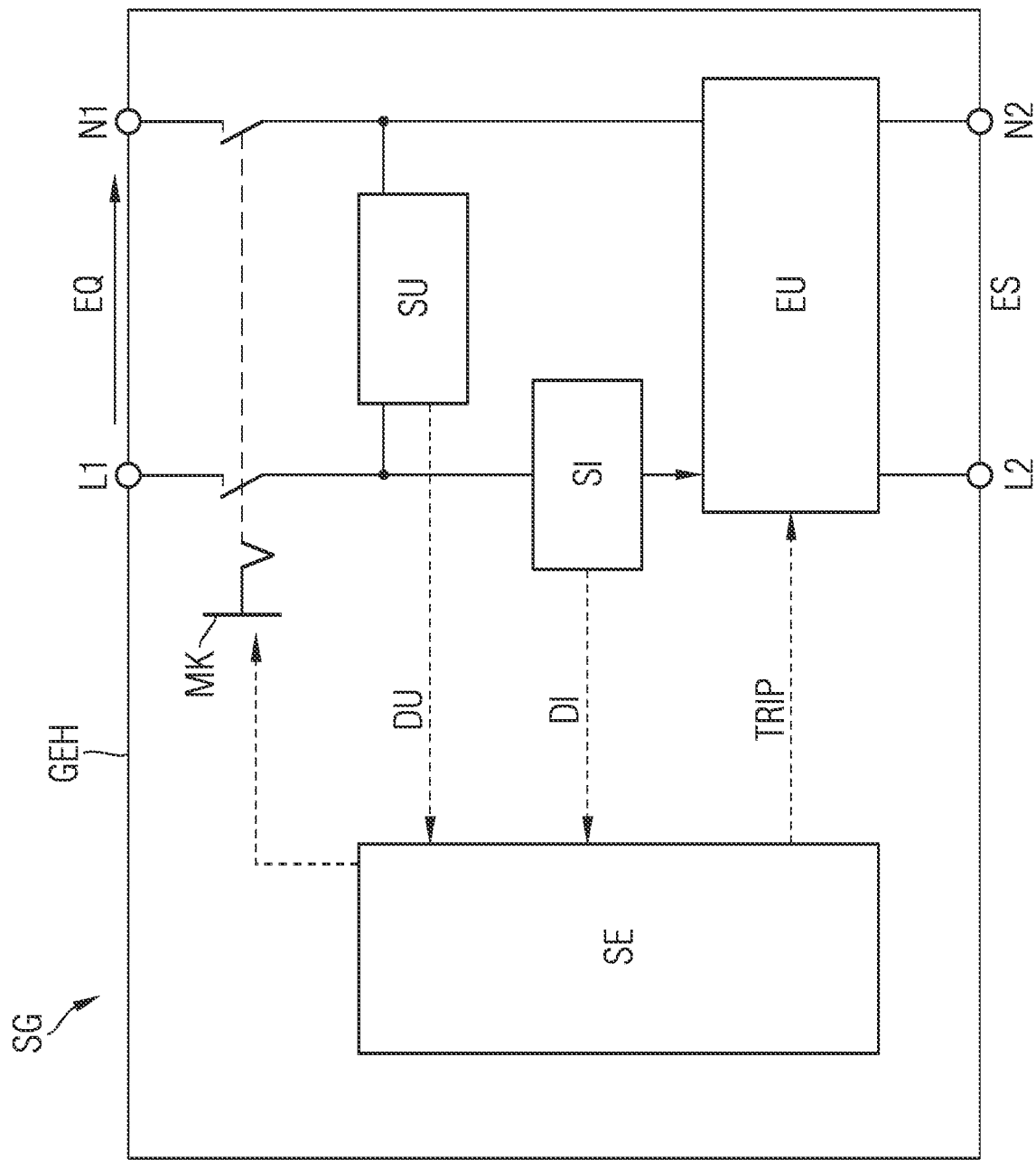
FIG. 1 shows a representation of a circuit breaker device.

FIG. 1 shows a representation of a circuit breaker device SG for protecting an electrical low-voltage circuit having a housing GEH, comprising:
  connections for conductors of the low-voltage circuit, in particular first connections L1, N1 for a system-side, in particular energy-source-side, connection EQ of the circuit breaker device SG and second connections L2, N2 for a load-side, in particular energy-sink-side—in the case of passive loads—, connection ES of the circuit breaker device SG, there being able to be provision for specifically phase-conductor-side connections L1, L2 and neutral-conductor-side connections N1, N2;
the load-side connection can comprise a passive load or/and an active load ((further) energy source), or a load that can be both passive and active, e.g. sequentially in time;
  a voltage sensor SU in order to (periodically) ascertain the level of the voltage of the low-voltage circuit, with the result that voltage values are available (cyclically),
  an electronic interruption unit EU that, as a result of semiconductor-based switching elements, has a high-impedance state for the switching elements for the purpose of interruption and a low-impedance state for the switching elements for the purpose of current flow in the low-voltage circuit,
  a control unit SE connected to the voltage sensor and to the interruption unit.

The circuit breaker device (SG) is configured such that the ascertained voltage values and an expected value for the voltage are used to ascertain a difference voltage (DU), with the result that difference voltage values (DU) are available cyclically. Each difference voltage value (DU) is compared with a first threshold value, in particular in terms of absolute value. If at least two successive difference voltage values (DU) have exceeded, the electronic interruption unit (EU), which is put into a high-impedance state for this purpose, initiates interruption of the low-voltage circuit in order to protect the low-voltage circuit from short circuits.

The expected value for the voltage can be ascertained for example by what is known as a phase locked loop, PLL for short. A PLL is an electronic circuit arrangement that influences the phase and, in association therewith, the frequency of a variable oscillator by way of a closed control loop in such a way that the phase error between an external periodic reference signal and the oscillator or a signal derived therefrom is as constant as possible.

It is thus possible to ascertain, among other things, the fundamental frequency and the amplitude thereof for the supplied system voltage, i.e. the ascertained voltage values, i.e. the (undisturbed or filtered) expected value of the (system) voltage.

The expected value delivered by the PLL for the voltage can then be compared with the ascertained voltage value, in particular in a time- or phase-synchronous manner, with the result that a difference between the values is available. Often, a PLL itself can perform such a function, i.e. deliver the difference, i.e. a difference voltage value DU.

The difference voltage is then compared with the threshold value, in particular in terms of absolute value.

Alternatively, the expected value for the voltage can also be stored in a table, wherein the respective voltage values are then compared in a phase-synchronous manner or a phase-synchronous difference is calculated, with the result that difference voltage values are available.

The difference voltage values can be ascertained for example in the voltage sensor SU itself or in the control unit SE, with the result that difference voltage values DU are available cyclically.

In addition, for one configuration of the invention, there can furthermore be provision for a current sensor SI for the purpose of (periodically) ascertaining the level of the current in the low-voltage circuit, with the result that current values are (cyclically) available, as shown in the example in FIG. 1. The current sensor SI is then connected to the control unit SE. Current change values can be ascertained for example in the current sensor SI itself or in the control unit SE. That is to say the current change value can in principle be ascertained either in analog form or in digital form.

The electronic interruption unit EU is shown as a block in the two conductors in FIG. 1. In a first variant, this means no interruption of the two conductors. At least one conductor, in particular the active conductor or phase conductor, has semiconductor-based switching elements. The neutral conductor can be free of switching elements, i.e. without semiconductor-based switching elements. That is to say that the neutral conductor is connected directly, i.e. does not acquire high impedance. That is to say only single-pole interruption (of the phase conductor) takes place. If there is provision for further active conductors/phase conductors, then, in a second variant of the electronic interruption unit EU, the phase conductors have semiconductor-based switching elements. The neutral conductor is connected directly, i.e. does not acquire high impedance. By way of example, for a three-phase AC circuit.

In a third variant of the electronic interruption unit EU, the neutral conductor can likewise have a semiconductor-based switching element, i.e. interruption by the electronic interruption unit EU results in both conductors acquiring high impedance.

The electronic interruption unit EU can comprise semiconductor components such as bipolar transistors, field-effect transistors, isolated gate bipolar transistors (IGBTs), metal-oxide-semiconductor field-effect transistors (MOSFETs) or other (self-commutated) power semiconductors. In particular, IGBTs and MOSFETs are particularly well suited for the circuit breaker device according to the invention due to low flow resistances, high barrier junction resistances and good switching performance.

The circuit breaker device SG can preferably also comprise a mechanical isolating contact system MK, in particular according to the standard with standard-compliant isolator properties, for electrical isolation of the circuit, in particular for standard-compliant isolation (as opposed to breaking) of the circuit. The mechanical isolating contact system MK may be connected to the control unit SE, as shown in FIG. 1, with the result that the control unit SE can initiate electrical isolation of the circuit. Specifically, further evaluation may be implemented that brings about electrical isolation if other criteria are satisfied. By way of example, there may be provision for overcurrent detection, for example in the control unit SE, that carries out semiconductor-based or/and electrical interruption of the circuit in the event of overcurrents, i.e. when current-time limit values are exceeded, i.e. when a current that exceeds a current limit value is present for a specific time, i.e. for example a specific energy threshold value is exceeded. Alternatively or additionally, a detected short circuit can also result in electrical isolation being initiated, for example.

In a further advantageous configuration, electrical isolation can be initiated if the electronic interruption unit EU is at high impedance and there is a current in the low-voltage circuit, detected in particular by the current sensor SI, that exceeds a third threshold value. Depending on the field of use of the circuit breaker device, the third threshold value can be in the order of magnitude of from 4 to 6 mA, in particular can be 5 mA or 6 mA. The third threshold value can be in the range from 26 mA to 30 mA, in particular can be 28 mA, 29 mA or 30 mA, in particular for personnel protection in Europe. The third threshold value can be in the range from 290 mA to 300 mA, each of the marginal and intermediate values being disclosed, in particular for fire safety.

In a first variant, the mechanical isolating contact system MK can interrupt on a single-pole basis. That is to say that only one conductor of the two conductors, in particular the active conductor or phase conductor, is interrupted, i.e. has a mechanical contact. The neutral conductor is then free of contacts, i.e. the neutral conductor is connected directly.

If there is provision for further active conductors/phase conductors, then, in a second variant, the phase conductors have mechanical contacts of the mechanical isolating contact system. In this second variant, the neutral conductor is connected directly. By way of example, for a three-phase AC circuit.

In a third variant of the mechanical isolating contact system MK, the neutral conductor likewise has mechanical contacts, as shown in FIG. 1.

Mechanical isolating contact system MK means in particular a (standard-compliant) isolating function, provided by the isolating contact system MK. Isolating function means the points:
- minimum air gap according to the standard (minimum distance between the contacts),
- contact position indication for the contacts of the mechanical isolating contact system,
- operation of the mechanical isolating contact system always possible (no locking of the isolating contact system).

With regard to the minimum air gap between the contacts of the isolating contact system, this is substantially voltage-dependent. Other parameters are the degree of soiling, the type of field (homogeneous, inhomogeneous) and the air pressure or the height above sea level.

There are appropriate regulations or standards for these minimum air gaps or creepage distances. In air, for example, these regulations indicate the minimum air gap for a surge withstand capability for an inhomogeneous and a homogeneous (ideal) electrical field on the basis of the degree of soiling. The surge withstand capability is the strength when an applicable surge voltage is applied. Only if this minimum length (minimum distance) exists does the isolating contact system or circuit breaker device have an isolating function (isolator property).

Within the context of the invention, the series of standards DIN EN 60947, or IEC 60947, which are mentioned here by way of reference, is relevant to the isolator function and the properties thereof in this instance.

The isolating contact system is advantageously characterized by a minimum air gap between the open isolating contacts in the OFF position (open position, open contacts) on the basis of the rated surge withstand capability and the degree of soiling. The minimum air gap is in particular between (a minimum of) 0.01 mm and 14 mm. In particular, the minimum air gap is advantageously between 0.01 mm at 0.33 kV and 14 mm at 12 kV, in particular for degree of soiling 1 and in particular for inhomogeneous fields.

The minimum air gap can advantageously have the following values:

E DIN EN 60947-1 (VDE 0660-100):2018-06

TABLE 13 minimum air gaps

| Rated surge withstand capability $U_{imp}$ | Minimum air gaps mm | | | | | | | |
|---|---|---|---|---|---|---|---|---|
| | Case A inhomogeneous field (see 3.7.63) Degree of soiling | | | | Case B homogeneous field, ideal conditions (see 3.7.62) Degree of soiling | | | |
| kV | 1 | 2 | 3 | 4 | 1 | 2 | 3 | 4 |
| 0.33 | 0.01 | 0.2 | 0.8 | 1.6 | 0.01 | 0.2 | 0.8 | 1.6 |
| 0.5 | 0.04 | | | | 0.04 | | | |
| 0.8 | 0.1 | | | | 0.1 | | | |
| 1.5 | 0.5 | 0.5 | | | 0.3 | 0.3 | | |
| 2.5 | 1.5 | 1.5 | 1.5 | | 0.6 | 0.6 | | |
| 4.0 | 3 | 3 | 3 | 3 | 1.2 | 1.2 | 1.2 | |
| 6.0 | 5.5 | 5.5 | 5.5 | 5.5 | 2 | 2 | 2 | 2 |
| 8.0 | 8 | 8 | 8 | 8 | 3 | 3 | 3 | 3 |
| 12 | 14 | 14 | 14 | 14 | 4.5 | 4.5 | 4.5 | 4.5 |

NOTE
The smallest air gaps indicated are based on the 1.2/50-µs surge voltage at an air pressure of 80 kPa, corresponding to the air pressure at 2000 m above sea level.

The degrees of soiling and types of field are consistent with those defined in the standards. This advantageously allows a standard-compliant circuit breaker device dimensioned according to the rated surge withstand capability to be achieved.

Figure 2:
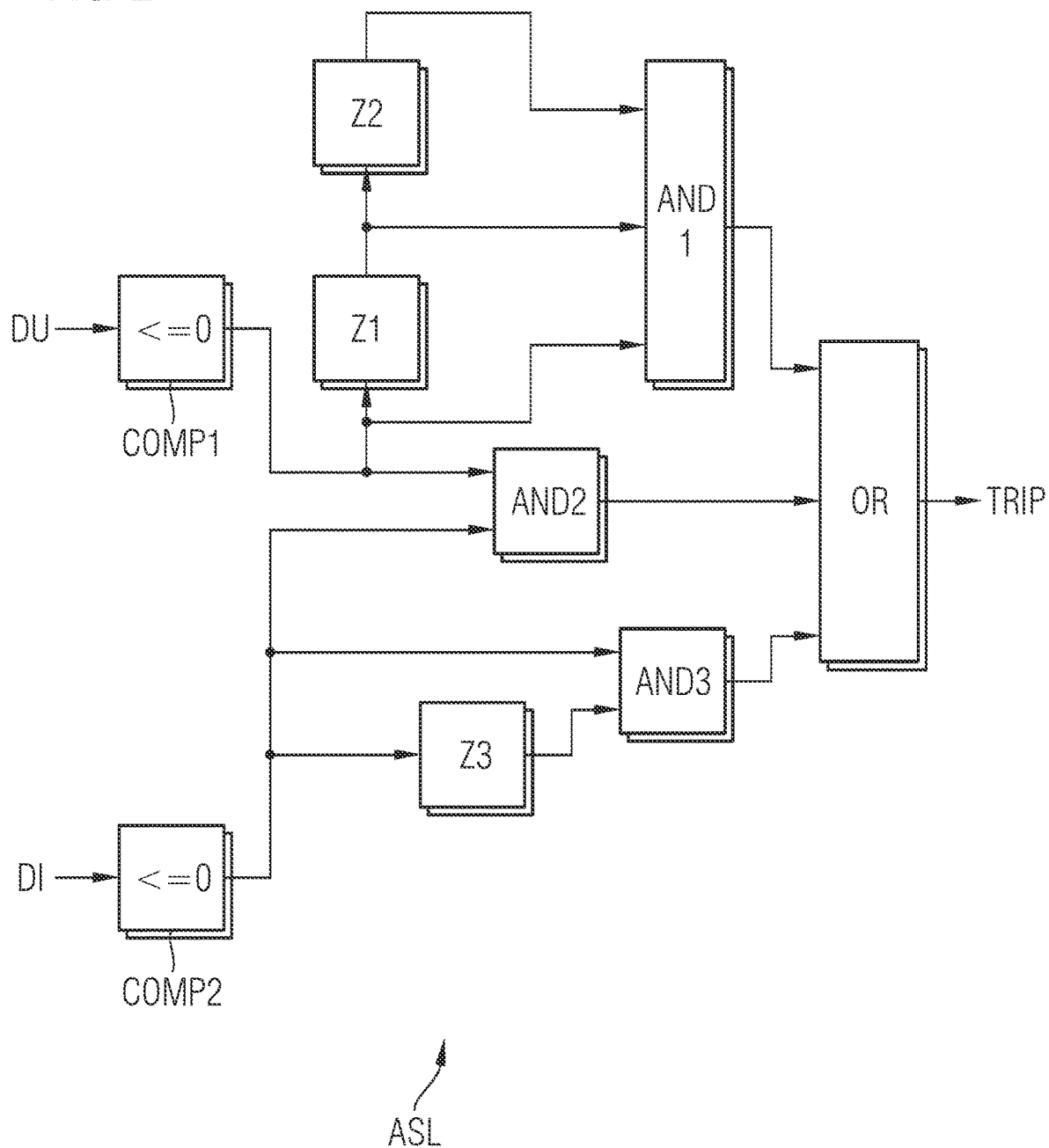
FIG. 2 shows a representation of break logic.

FIG. 2 shows a representation of break logic ASL, as may be implemented for example in the control unit SE in FIG. 1, for example in terms of function or circuitry. The difference voltage values DU are supplied (cyclically) to a first comparator COMP1 in order to compare each difference voltage value DU with the first threshold value. Furthermore, the output of the first comparator COMP1 is connected to a first AND gate AND1:
firstly directly,
secondly via a first buffer store Z1, which (cyclically) buffer-stores precisely one comparator output value,
in the configuration in FIG. 2 thirdly via the first buffer store Z1 with a second buffer store Z2, which (cyclically) buffer-stores precisely one comparator output value,
with the result that interruption of the low-voltage circuit is initiated, for example by the interrupt signal TRIP transmitted from the control unit SE to the electronic interruption unit EU, if in particular three successive difference voltage values DU have exceeded. Analogously, there may be provision for further buffer stores (four, five, . . . difference voltage values DU having exceeded).

FIG. 2 additionally shows a configuration in which there is provision for a current ascertainment device connected to the control unit, such that the change in current over time in the low-voltage circuit is ascertained periodically, with the result that current change values DI are available cyclically. The change in current over time can be ascertained for example in the current sensor SI itself or in the control unit SE. The current change values DI are supplied to a second comparator COMP2 which compares each current change value with a second threshold value. The output of the second comparator COMP2 is further connected to a third AND gate AND3 firstly directly and secondly via a third buffer store Z3, which (cyclically) buffer-stores precisely one comparator output value, with the result that interruption of the low-voltage circuit is initiated, for example by the interrupt signal TRIP transmitted from the control unit SE to the electronic interruption unit EU, if two successive current change values have exceeded.

In general, there may be provision for further buffer stores (three, four, five, . . . current change values having exceeded).

FIG. 2 additionally shows a configuration in which the outputs of the comparators COMP1, COMP2 are logically combined by way of a second AND gate AND2, with the result that interruption of the low-voltage circuit is initiated, for example by the interrupt signal TRIP transmitted from the control unit SE to the electronic interruption unit EU, if the first and second threshold values, ideally for the same clock cycle or for the preceding/subsequent or adjacent clock cycle, are exceeded.

FIG. 2 additionally shows a configuration in which the outputs of the first, second and third AND gates AND1, AND2, AND3 are combined by way of an OR gate OR, with the result that interruption of the low-voltage circuit is initiated, for example by the interrupt signal TRIP, which is delivered by the OR gate OR in this case, if at least two successive difference voltage values have exceeded or if at least two successive current change values have exceeded or if the first and second threshold values are exceeded within the first time window.

The difference voltage values and/or optionally current change values, or the voltage values and optionally current values, are ascertained (periodically), for example in the voltage sensor SU or current sensor SI or in the control unit SE, at a clock frequency that is greater than/equal to 10 kHz and less than/equal to 10 MHz, more specifically greater than/equal to 10 kHz and less than/equal to 1 MHz. Difference voltage values and/or optionally current change values, or voltage values and optionally current values, are thus available cyclically at intervals of time of between 100 µs and 0.1 µs, more specifically between 100 µs and 1 µs. The difference voltage values and/or optionally current change values for the same clock cycle, if identically clocked values are available, can thus be compared with the threshold values. Alternatively, a difference voltage value and/or optionally current change value for temporally corresponding clock cycles, if there is an interval of time, clock cycle difference, between voltage values and current values. The interval of time should not be greater than one clock cycle of the sampling. That is to say that, depending on the sampling rate, the first time window is precisely one clock cycle of the sampling rate long. That is to say that e.g. at a sampling rate of 100 kHz the clock cycle is 10 µs, i.e. the interval between two samples is 10 µs, i.e. the first time window is then no more than 10 µs.

The invention will be explained once again below using different words. Known short-circuit detection systems are based on the sole ascertainment of the actual value of the current. According to the invention, a circuit breaker device SG should incorporate only voltage measurement, for example in the form of voltage sensors SU. The voltage sensor SU should preferably have a bandwidth that is greater than the clock frequency. The same applies for the optional current sensor. The current sensor SI can have a measuring resistor or shunt, for example. The voltage sensor SU is used for early overcurrent and in particular short-circuit detection (alone). In addition, in one configuration, there can also be provision for a current sensor SI for current measurement in a similar manner.

A load on the load-side side of the circuit breaker device SG is bypassed by a very small resistance in the event of a short circuit. The measured voltage across the circuit breaker device dips sharply when a short circuit occurs on the (energy-sink-side) load side. According to the invention, it has been found that evaluation and calculation of a difference for the voltage (voltage value to expected voltage value (expected value for the voltage)) allow rapid early short-circuit detection.

The measured value processing and the break logic may be implemented e.g.: in the control unit SE, both in analog technology, in a computer, such as a microcontroller (µC) or a field programmable gate array (FPGA), or in some cases in analog technology and in some cases in a computer.

The (cyclic) difference voltage values DU and current change values DI, or voltage values and optionally current values, are compared with threshold values (limits), e.g. using comparators. Logic combinations between the comparison results (comparator output) allow different break conditions to be implemented, see FIG. 2.

FIG. 3 shows characteristics for current I in amps A (top) and voltage U in volts V (bottom) —on the vertical y axis—over time t in seconds s—on the horizontal x axis. It shows the simulated comparison of the time characteristic ERF of the present invention compared with the time characteristic KLA of simple (conventional) overcurrent breaking. A short circuit occurs at t=145 ms. The current I rises with a steep gradient and at the same time the measured voltage U dips abruptly.

The time characteristic KLA of the simple overcurrent breaking, which interrupts the flow of current if 200 A are exceeded. Latencies and break times mean that the current continues to rise for a short time after the limit value has been exceeded, however.

The time characteristic ERF of the short-circuit detection according to the invention is based on the detection of the sharp dip in the measured voltage, i.e. the difference voltage value DU, and optionally the high current change value (di/dt), and breaks within 30 µs, 20 µs or 10 µs. The invention operates at a sampling rate of 10 µs in this example. Thus, the minimum attainable break times for this case are also defined, and shown in FIG. 3. At shorter sampling rates (higher clock frequencies), shorter break times can be implemented.

The (cyclic) difference voltage values DU (voltage change values) and optionally current change values are compared with the threshold values by means of comparators. The outputs of the comparators (threshold value switches) are combined by way of various logic gates and buffer stores (delay elements). This implements different break conditions, which take account not only of the instantaneous actual value of the difference voltage value DU and optionally of the current change value but also of the history of the actual value of the difference voltage value DU and optionally of the current change value. FIG. 2 shows the illustrative break logic with three different trip conditions:
- if the difference voltage value DU exceeds the first threshold value (first limit value) in at least two (in the example three) successive clock cycles, a short circuit is detected,
- if the voltage change value DU and the current change value DI exceed the first and second threshold values (respective limit values) at the same time, a short circuit is detected,
- if the current change value DI exceeds the second threshold value (second limit value) in at least two (in the example precisely two) successive clock cycles, a short circuit is detected.

The invention has the advantage that the influence of the system impedance is reduced during the evaluation of the. The use of present and preceding ("old") measured values improves the performance of the detection, and instances of false tripping are reduced. The invention allows robust and reliable detection of short circuits.

Although the invention has been illustrated and described more thoroughly in detail by way of the exemplary embodiment, the invention is not restricted by the examples disclosed, and other variations can be derived therefrom by a person skilled in the art without departing from the scope of protection of the invention.

The invention claimed is:

1. A circuit breaker device for protecting an electrical low-voltage circuit, the circuit breaker device comprising:
    a housing having connections for conductors of the electrical the low-voltage circuit;
    an electronic interruption unit having semiconductor-based switch elements and as a result of said semiconductor-based switching elements, said electronic interruption unit has a high-impedance state for said semiconductor-based switching elements for a purpose of interruption and a low-impedance state for said semiconductor-based switching elements for a purpose of current flow in the electrical low-voltage circuit;
    a controller connected to said electronic interruption unit;
    a voltage sensor connected to said controller for ascertaining voltage values; and
    the circuit breaker device being configured such that the voltage values and an expected value for a voltage are used to ascertain a difference voltage, with a result that difference voltage values are available cyclically, each of the difference voltage values is compared with a first threshold value, and, if at least two successive ones of the difference voltage values exceed the first threshold value, said electronic interruption unit initiates the interruption of the electrical low-voltage circuit to protect the electrical low-voltage circuit from short circuits.

2. The circuit breaker device according to claim 1, further comprising a current sensor connected to said controller; and
    wherein the circuit breaker device is configured such that a change in current over time in the electrical low-voltage circuit is ascertained, with a result that current change values are available cyclically, each of the current change values is compared with a second threshold value and said electronic interruption unit initiates the interruption of the electrical low-voltage circuit if at least two successive ones of the current change values exceeds the second threshold value.

3. The circuit breaker device according to claim 2, wherein:
    each of the difference voltage values is compared with the first threshold value;
    each of the current change values is compared with the second threshold value; and
    said electronic interruption unit initiates the interruption of the electrical low-voltage circuit if the first and second threshold values are exceeded within a first-time window.

4. The circuit breaker device according to claim 2, wherein the difference voltage values and/or the current change values are ascertained periodically at a clock frequency that is greater than/equal to 10 KHz and less than/equal to 10 MHz.

5. The circuit breaker device according to claim 2, wherein the second threshold value is in a range from 1 to 10 A/µs.

6. The circuit breaker device according to claim 2, further comprising:
    a first AND gate;
    a first buffer store;
    a second buffer store; and
    a first comparator having an output, the difference voltage values being supplied to said first comparator to compare each of the difference voltage values with the first threshold value, and said output of said first comparator is connected to said first AND gate:
        firstly directly;
        secondly via said first buffer store which buffer-stores precisely one comparator output value;
        thirdly via said first buffer store with said second buffer store, which buffer-stores precisely one comparator output value; and
        with a result that the interruption of the electrical low-voltage circuit is initiated if at least two successive ones of the difference voltage values exceed the first threshold value.

7. The circuit breaker device according to claim 6, further comprising:
    a second AND gate having an output; and
    a second comparator having an output, the current change values being supplied to said second comparator in order to compare each of the current change values with the second threshold value, and said output of each of said first comparator and said second comparator is combined by way of said second AND gate, with a result that the interruption of the electrical low-voltage circuit is initiated if the first and second threshold values are exceeded.

8. The circuit breaker device according to claim 7, further comprising:
    at least one third buffer store; and
    a third AND gate having an output, said output of said second comparator is further connected to said third AND gate firstly directly and secondly via said at least one third buffer store, which buffer-stores precisely one comparator output value, with a result that the interruption of the electrical low-voltage circuit is initiated if at least two successive ones of the current change values exceed the second threshold value.

9. The circuit breaker device according to claim 8, further comprising an OR gate, said outputs of said first, second and third AND gates are combined by way of said OR gate, with a result that the interruption of the electrical low-voltage circuit is initiated:
- if at least two successive ones of the difference voltage values exceed the first threshold value; or
- if the first and second threshold values are exceeded within a first-time window; or
- if at least two successive ones of the current change values have exceeded the second threshold value.

10. The circuit breaker device according to claim 1, further comprising a mechanical isolating contact system connected in series with said electronic interruption unit, with a result that electrical isolation can be engaged in the electrical low-voltage circuit, and said mechanical isolating contact system is connected to said controller.

11. The circuit breaker device according to claim 10, wherein said electronic interruption unit initiates the interruption of the electrical low-voltage circuit, said mechanical isolating contact system also initiates the interruption of the electrical low-voltage circuit in order to protect the electrical low-voltage circuit from the short circuits.

12. The circuit breaker device according to claim 10, wherein the electrical isolation is initiated if said electronic interruption unit is at the high impedance state and there is a current in the electrical low-voltage circuit that exceeds a third threshold value.

13. The circuit breaker device according to claim 12, wherein the third threshold value is greater than 5 mA.

14. The circuit breaker device according to claim 13, wherein the third threshold value in a range of 290 mA to 300 mA.

15. The circuit breaker device according to claim 1, wherein the first threshold value is in a range from 10 to 100 V.

16. A method for protecting an electrical low-voltage circuit, which comprises the steps of:
- ascertaining a level of a voltage of the electrical low-voltage circuit with a result that ascertained voltage values are available;
- using the ascertained voltage values and an expected value for the voltage to ascertain a difference voltage, with a result that difference voltage values are available cyclically; and
- comparing each of the difference voltage values with a first threshold value, and if at least two successive ones of the difference voltage values exceed the first threshold value, semiconductor-based switching elements are put into a high-impedance state which initiates interruption of the electrical low-voltage circuit to protect the electrical low-voltage circuit from short circuits.

17. The method according to claim 16, which further comprises:
- ascertaining a change in a current over time in the electrical low-voltage circuit with a result that current change values are available cyclically;
- comparing each of the current change values with a second threshold value;
- using semiconductor-based switching elements, which are put into the high-impedance state, to initiate the interruption of the electrical low-voltage circuit if at least two successive ones of the current change values exceed the second threshold value.

18. The method according to claim 17, which further comprises putting the semiconductor-based switching elements into the high-impedance state for initiating the interruption of the electrical low-voltage circuit if the first and second threshold values are exceeded within a first-time window.

19. The method according to claim 18, wherein the semiconductor-based switching elements have a low-impedance state for a purpose of current flow in the electrical low-voltage circuit.

20. The method according to claim 16, which further comprises initiating electrical isolation if an electronic interruption unit is at high impedance and there is a current in the electrical low-voltage circuit that exceeds a third threshold value.

* * * * *